US008546930B2

(12) United States Patent
Bakir et al.

(10) Patent No.: US 8,546,930 B2
(45) Date of Patent: Oct. 1, 2013

(54) 3-D ICS EQUIPPED WITH DOUBLE SIDED POWER, COOLANT, AND DATA FEATURES

(75) Inventors: Muhannad S. Bakir, Atlanta, GA (US); Gang Huang, Austin, TX (US)

(73) Assignee: Georgia Tech Research Corporation, Atlanta, GA (US)

( * ) Notice: Subject to any disclaimer, the term of this patent is extended or adjusted under 35 U.S.C. 154(b) by 762 days.

(21) Appl. No.: 12/694,174

(22) Filed: Jan. 26, 2010

(65) Prior Publication Data

US 2010/0187683 A1    Jul. 29, 2010

Related U.S. Application Data

(63) Continuation-in-part of application No. 12/128,542, filed on May 28, 2008, now Pat. No. 7,928,563.

(51) Int. Cl.
*H01L 23/02* (2006.01)

(52) U.S. Cl.
USPC ........... 257/686; 257/713; 257/714; 257/715; 257/E23.087; 257/E23.098; 257/E25.006

(58) Field of Classification Search
USPC .......... 257/777, 723, 773, E25.006, E25.013, 257/E25.021, E25.027, 698, 706, 707, E25.018, 257/713–716, E33.075, E31.131, E23.08–E23.113, 257/E23.169–E23.178, 712, 686
See application file for complete search history.

(56) References Cited

U.S. PATENT DOCUMENTS

| 6,287,949 B1 | 9/2001 | Mori et al. |
| 6,710,435 B2 | 3/2004 | Nagaya |
| 7,266,267 B2 | 9/2007 | Bakir et al. |

(Continued)

FOREIGN PATENT DOCUMENTS

| WO | 8802979 | 4/1988 |
| WO | 2007071674 | 6/2007 |

OTHER PUBLICATIONS

Dang, Bing (Ph.D. Thesis); "Integrated Input/Output Interconnection and Packaging for GSI"; Georgia Institute of Technology School of Electrical and Computer Engineering, Apr. 17, 2006, pp. 1-209.

(Continued)

*Primary Examiner* — Jasmine Clark
(74) *Attorney, Agent, or Firm* — Troy S. Kleckley, Esq.; Ryan A. Schneider, Esq.; Troutman Sanders LLP

(57) ABSTRACT

Three dimensional integrated circuits with double sided power, coolant, and data features and methods of constructing same are provided. According to some embodiments, an integrated circuit package can generally comprise one or more semiconductor wafers and opposing end substrates. The semiconductor wafers can each have a top exterior surface and a bottom exterior surface. The plurality of semiconductor wafers can form a multi-dimensional wafer stack of die wafers such that adjacent wafers have facing surfaces. Each of the semiconductor wafers can comprise one or more channels formed through the wafers. A portion of the channels can extend generally between the top and bottom exterior surfaces of the semiconductor wafers. A portion of the channels can carry conductors for coupling the wafers and/or coolant for cooling the wafers. The opposing end substrates can be disposed proximate opposing ends of the multi-dimensional stack. The opposing end substrates can be configured to supply power, coolant, and data signals to opposing ends of the multi-dimensional wafer stack. Other embodiments are also claimed and described.

20 Claims, 9 Drawing Sheets

Use of external tubes for fluidic

(56) References Cited

U.S. PATENT DOCUMENTS

| | | | |
|---|---|---|---|
| 7,355,277 B2* | 4/2008 | Myers et al. | 257/712 |
| 2006/0145356 A1* | 7/2006 | Liu et al. | 257/777 |
| 2007/0172987 A1 | 7/2007 | Dugas et al. | |
| 2009/0294954 A1 | 12/2009 | Bakir et al. | |

OTHER PUBLICATIONS

Dang, Bing et al., "Wafer-Level Microfluidic Cooling Interconnects for GSI", 2005 IEEE, pp. 180-182.

Dang, Bing et al., "Integrated Thermal-Fluidic I/O Interconnects for an On-Chip Microchannel Heat Sink", IEEE Electron Device Letters, vol. 27, No. 2, Feb. 2006, pp. 117-119.

Thompson, Terrence E., "Exploring Options for Keeping the Heat Out", Aug./Sep. 2006 Chip Sale Review, pp. 42-53.

Toon, John, "Beating the Heat: Liquid Cooling Technique Uses Microfluidic Channels Integrated onto the Backs of Chips", Jun. 21, 2005, Georgia Tech Research News, pp. 1-4.

Bakir, Muhannad S. et al., "Revolutionary NanoSilicon Ancillary Technologies for Ultimate-Performance Gigascale Systems", IEEE 2007, Custom Integrated Circuits Converence (CICC); pp. 421-428.

Topol, A.W., et al., "Three-Dimensional Integrated Circuits", IBM Journal of Research & Development, vol. 50, No. 4/5, Jul./Sep. 2006, pp. 491-506.

Gurrum, Siva P. et al., "Thermal Issues in Next-Generation Integrated Circuits", IEEE Transactions on Device and Materials Reliability, vol. 4, No. 4, Dec. 2004, pp. 709-714.

Thacker, Hiren Dilipkumar (Ph.D. Thesis), "Probe Modules for Wafer-Level Testing of Gigascale Chips with Electrical and Optical I/O Interconnects", Georgia Institute of Technology School of Electrical and Computer Engineering, May 2006, pp. 1-280.

Koo, Jae-Mo et al., "Integrated Microchannel Cooling for Three-Dimensional Electronic Circuit Architectures", Journal of Heat Transfer, Jan. 2005, vol. 127, pp. 49-58.

Tuckerman, D.B. et al., "High-Performance Heat Sinking for VLSI", IEEE Electron Device Letters, vol. EDL-2, No. 5, May 1981, pp. 126-129.

Viswanath, Ram et al., "Thermal Performance Challenges from Silicon to Systems", Intel Technology Journal, Q3, 2000, pp. 1-16.

Internet Article from www.bgasockets.com, Aug.-Sep. 2006, p. 29.

* cited by examiner

Board level fluidic

Use of external tubes for fluidic (+) conductivity; smaller diameter TSVs
(+) More TSVs per fixed Si area
(+) electromigration & current density
(+) may not need elaborate barrier as Cu
(+) CNT growth rate

3-D ICS EQUIPPED WITH DOUBLE SIDED POWER, COOLANT, AND DATA FEATURES

CROSS REFERENCE TO RELATED APPLICATION & PRIORITY CLAIM

This patent application claims priority to and is a continuation-in-part of U.S. patent application Ser. No. 12/128,542, filed 28 May 2008, which is hereby incorporated by reference as if fully set forth below.

TECHNICAL FIELD

Embodiments of the present invention relate generally to integrated circuits and associated manufacturing methods, and more particularly to, three dimensional integrated circuits and methods of constructing same including double sided power, coolant, and data signal features.

BACKGROUND

As transistor technology continues to scale and integration density increases, one performance limiter of an IC chip will be heat management and/or removal. Not only does heat affect device operation but it may also affect end user usage patterns. Because transistors and interconnects reliability and performance depend on operating temperatures, cooling electronics and diminishing device hot spots has never been greater. With the continued scaling of device features and increased power density, chip cooling has become increasingly difficult and costly.

One method of continued scaling includes three-dimensional stacking of chips used to form a stacked integrated circuit package. Three-dimensional (3-D) die (e.g., silicon chip die) stacking increases transistor density and chip functionality by vertically integrating two or more dice. 3-D integration also improves interconnect speed by decreasing interconnect wire length, enables smaller system form factor, and reduces power dissipation and crosstalk.

Motivations for three-dimensional (3D) integration include reduction in system size, interconnect delay, power dissipation, and enabling hyper-integration of chips fabricated using disparate process technologies. Although various low-power commercial products implement improved performance and increased device packing density realized by 3D stacking of chips (e.g., using wire bonds), such technologies are not suitable for high-performance chips due to ineffective power delivery and heat removal. For example, high performance chips are projected to dissipate more than 100 W/cm2 and require more than 100 A of supply current. Consequently, when such chips are stacked, challenges in power delivery and cooling become greatly exacerbated.

There exists a need for three dimensional integrated circuits and methods of constructing same including microfluidic interconnects for managing thermal energy created during operation of integrated circuits and also managing power supply noise. It is to the provision of such three dimensional integrated circuits and fabrication methods that the various embodiments of the present invention are directed.

BRIEF SUMMARY

Various embodiments of the present invention are directed to three dimensional integrated circuits and methods of constructing same including microfluidic interconnects for managing thermal energy created during operation of integrated circuits. According to some embodiments, such devices are configured to operate in a manner to control and/or manage heat dissipation provided from an IC.

Generally described, an integrated circuit package according to some embodiments can generally comprise a plurality of semiconductor wafers each having a top exterior surface and a bottom exterior surface. The plurality of semiconductor wafers can form a multi-dimensional wafer stack of die wafers. Adjacent wafers can have facing surfaces. Each of the semiconductor wafers can comprise one or more channels formed through the wafers. A portion of the channels can extend generally between the top and bottom exterior surfaces of the semiconductor wafers. A portion of the channels can carry conductors for electronically or optically coupling the semiconductor wafers. In some embodiments, opposing end substrates can be disposed proximate opposing ends of the multi-dimensional stack. The opposing end substrates can be configured to supply power to the opposing end substrates of the multi-dimensional wafer stack.

Integrated circuit packages according to some embodiments can also include additional features. For example, opposing end substrates can be configured to supply a coolant liquid to the opposing end substrates of the multi-dimensional wafer stack. Also some embodiments can comprise at least one micro-pipe. A micro-pipe can be disposed between adjacent or proximately situated semiconductor wafers in a stack. Micro-pipes can have opposed ends, and the ends can be coupled to adjacent semiconductor wafers. Micro-pipes can be configured to enable at least a portion of one or more of the semiconductor wafers to be in fluid communication with each other for cooling. As another example, opposing end substrates can comprise internal electrical conductors. And a conductive material can couple internal electrical conductors from the substrate together so that the internal electrical conductors are electrically coupled.

Integrated circuit packages according to some embodiments may also include additional features. For example, conductive material for use with a semiconductor wafer can be one of a substrate-to-substrate interconnect and a power cord. Some embodiments may also include at least one capacitor disposed on or integrated with one of the opposing end substrates. Also some embodiments can comprise at least one capacitor disposed on or integrated with at least one of the semiconductor wafers. Still yet some embodiments can comprise micro-pipes disposed between adjacent semiconductor wafer surfaces. Micro-pipes can be disposed in at least one of horizontal, vertical, or diagonal arrangement between semiconductor die wafers. Some embodiments can also comprise a plurality of micro-pin heat sinks disposed between adjacent wafers in the multi-dimensional wafer stack. Micro-pin heat sinks can comprise an inner electrically conductive material arranged in a coaxial arrangement with an outer heat dissipating material. Also embodiments can include a plurality of carbon nanotube bundles. Such bundles can be disposed between and electrically couple adjacent wafers in the multi-dimensional wafer stack.

Other system embodiments of the present invention can be utilized in a three dimensional integrated circuit package comprising multiple wafers stacked upon each other to form a three dimensional wafer stack. For example, a system can be used to provide power, coolant, and signals from multiple sides of three dimensional circuit packages. Exemplary system embodiments can generally comprise a plurality of semiconductor wafers, and plurality of interconnects, a plurality of channels, and opposing end substrates. Semiconductor wafers can be stacked upon each other in a vertical arrangement to form a vertical stack of wafers. The interconnects can be a plurality of electronic or optical interconnects. Interconnects can be disposed within vias disposed within the semiconductor wafers. The interconnects can correspond to interconnects in an adjacent semiconductor wafer. In this arrangement, adjacent semiconductor wafers can be operatively configured to communicate with each other. The channels can be a plurality of coolant fluidic channels. The channels can be disposed within the plurality of semiconductor wafers and can form a coolant loop through the three dimensional stack. Such an arrangement of channels can be used to remove heat emitted from within the vertical stack of wafers. The opposing end substrates can be disposed proximate opposing ends of the vertical stack of wafers. The opposing end substrates can be configured to supply power and coolant to the opposing end substrates of the multi-dimensional wafer stack.

System embodiments of the present invention can also include additional features. For example a system can include a plurality of micro-pipes. Micro-pipes can be disposed generally between semiconductor wafers. Micro-pipes can transport coolant between adjacent semiconductor wafers. In some embodiments, each of the micro-pipes can have approximately the same diameter and be formed on opposing sides of the semiconductor wafers. In addition some systems can include one or more capacitors and/or other passive devices. These components can be disposed proximate one of the opposing end substrates and proximate at least one of the plurality of semiconductor wafers.

Embodiments of the present invention can also include additional features. For example, interconnects used in systems covered herein can be arranged so that at least some interconnects are configured as heat sinks to dissipate heat from the interconnects. In addition, interconnects can comprise a heat dissipating material arranged around the interconnects for heat dissipation. Also some of the interconnects can comprise a first conductive material disposed within a second material that is a heat dissipation material. In addition, some embodiments can have at least one of a plurality of semiconductor wafers that defines through silicon vias. Carbon nanotubes or carbon nanotube bundles can be disposed within the through silicon vias. Still yet, embodiments can include opposing end sources that are coupled to electrical and coolant sources to provide double sided power, coolant, and electrical/optical data signals to the wafer stack. In other exemplary embodiments at least one of the opposing end substrates can be an interposer. The interposer can comprise silicon, glass, organic, or a combination thereof. In still yet other embodiments, the interposer can be configured to contact to an array of 3D stacks of substantially the same height.

Other aspects and features of embodiments of the present invention will become apparent to those of ordinary skill in the art, upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments it is to be understood that such exemplary embodiments can be implemented in various systems, and methods. Embodiments of the present invention can be implemented with hardware components, software logic, or a combination of both.

DETAILED DESCRIPTION OF PREFERRED & ALTERNATIVE EMBODIMENTS

Figure 1:
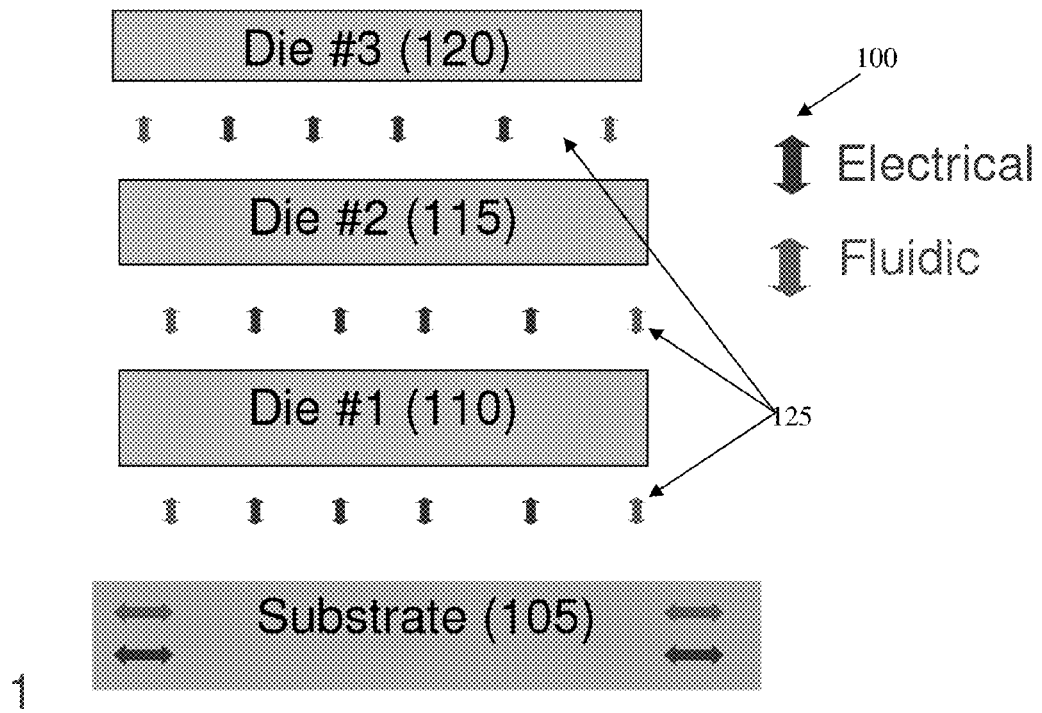
FIG. 1 illustrates a block diagram of an exploded, exemplary 3-D integrated circuit package that includes a microfluidic cooling system in accordance with some embodiments of the present invention.

The International Technology Roadmap for Semiconductors (ITRS) projects that power dissipation will reach 151 W and 198 W for cost performance and high-performance applications, respectively, by 2018 at the 18 nm technology node. Consequently, it is not likely that conventional heat removal techniques will meet the power density, heat flux, and thermal resistance needs of future high performance microprocessors.

Liquid cooling using microchannels, as discussed herein, can meet the thermal management requirements of high-performance microprocessors due to high heat transfer coefficient. Although a number of researchers have explored advantages of using liquid cooling to mitigate future thermal management problems, heretofore many unknowns existed for implementation, especially for 3-D integrated systems. These unknowns include fabrication of an on-chip microfluidic heat sink and integration of electrical through-silicon vias (TSVs), where to place fluidic I/O interconnects for 3D chips, how to supply fluid to and extract fluid from microchannels embedded in a 3D stack, and how to assemble 3D ICs with microfluidic functionality. As mentioned above, embodiments of the present invention enables and provides process integration and assembly technologies for a proposed microfluidic liquid cooling configuration to cool three-dimensional ICs.

Referring now to the figures, wherein like reference numerals represent like parts throughout the several views, exemplary embodiments of the present invention will be described in detail. Throughout this description, various components may be identified as having specific values or parameters, however, these items are provided as exemplary embodiments. Indeed, the exemplary embodiments do not limit the various aspects and concepts of the present invention as many comparable parameters, sizes, ranges, and/or values may be implemented.

FIG. 1 illustrates a block diagram of an exploded, exemplary three dimensional integrated circuit package 100 that includes a microfluidic cooling system 125 in accordance with some embodiments of the present invention. As shown, the IC package generally includes a microchannel heat sink integration into each stratum of a 3D stack. Such an arrangement can enables cooling of about >100 W/cm2. The arrangement can also be used to providing microchannel cooling of up to ~800 W/cm2. In addition, the IC package 100 generally includes a substrate 105 for carrying multiple die wafers 110, 115, 120. The cooling system 125 includes electrical and fluidic connections disposed between adjacent surfaces of the multiple die wafers 110, 115, 120.

In the embodiments disclosed herein, the embodiments generally include a stack of wafers with electrical and fluidic interconnections connecting the wafers in the stack. The electrical interconnections can be of many different conductors and can be implemented as through wafer vias. The fluidic interconnections enable coolant to be routed through a wafer stack. The fluidic interconnections can include pipes (e.g., polymer micro pipes) disposed between wafers and channels formed through the wafers. The pipes can be aligned with the channels in coaxial arrangement to ensure fluid flow therethrough. In some embodiments, a barrier layer can be disposed or provided within the interior surfaces of the pipes and channels. Use of such a barrier layer may be desired to prevent coolant from being absorbed by the pipes and channels.

Coolant can be provided from one or more external sources in accordance with embodiments of the present invention. As coolant is provided to the IC package 100, it is routed through the IC package by virtue of channels and pipes. Coolant flowing through the channels and pipes absorbs heat from the IC package 100 and due to this heat exchange system, coolant can control and/or manage heat dissipated by the IC package 100. It should be understood that embodiments of the present invention can also include embodiments where a cooling network of channels and pipes can be disposed within an IC package. Such a cooling network can include horizontal, diagonal, vertical, or a combination thereof of coolant channels to route coolant through an IC package. The channels can be routed through or on substrates and/or wafers of an IC package.

As illustrated, the IC package 100 includes multiple electrical and fluidic connections between wafers. The fluidic connections are generally disposed on opposing ends of the wafers and provide fluid channels for delivery of a coolant. Such coolant can be any material to absorb heat from the IC package such that heat is moved from the IC package. While illustrated as vertical interconnections, the fluidic channels can be horizontal or diagonal channels for coolant. In addition, the microfluidic channels can enable horizontal coolant flow through a wafer for cooling purposes. As further shown in FIG. 1, coolant can be routed through the IC package's substrate. Such an arrangement provides a coolant inlet and outlet through the substrate.

Utilization of microfluidic channels enables management of heat produced during operation of the IC package 100. Indeed, heat is managed and redirected from the 3D IC package 100 by integrating microchannel heat sinks within each stratum (chip) in the 3D stack. In addition, a liquid coolant is delivered to the microchannel heat sinks within the 3D stack using a thermofluidic interconnect network that is composed of polymeric microfluidic chip I/Os (micropipes) and microfluidic through silicon vias. The thermofluidic interconnect network within the IC package 100 can be integrated with conventional solder bumps and electrical TSVs. Integration in this arrangement enables power delivery and communication between the different chips within the 3D stack of the IC package 100.

Other embodiments and methods are also contemplated in accordance with the present invention. For example, other methods of electrical bonding are compatible with the micropipes (for example, compliant leads, Cu—Cu bonding, etc). Unlike prior work on microfluidic cooling of ICs that require millimeter-sized and bulky fluidic inlets/outlets to the microchannel heat sink, micropipe I/Os according to embodiments of the present invention are microscale, wafer-level batch fabricated, area-array distributed, flip-chip compatible, and mechanically compliant. Electrical TSVs can be, for example fabricated with an aspect ratio of 8:1; other greater ratios (e.g., 49:1) are also possible in accordance with embodiments of the present invention. An exemplary process used to fabricate the microchannel heat sink, electrical and microfluidic TSVs, and the solder bumps (e.g., C4 bumps) and microfludic I/Os is explained below. Temperatures used during fabrication can be maintained below 260 Celsius. Fabrication of the 3D thermofluidic interconnect network 100, which only requires four minimally demanding masking steps, is compatible with CMOS process technology and flip-chip assembly.

Figure 2:
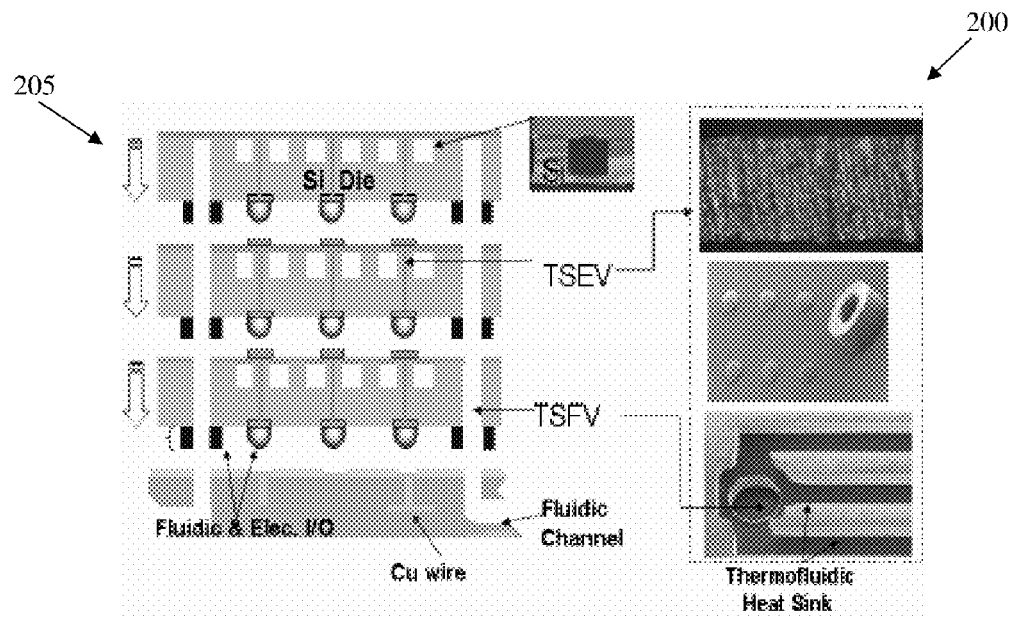
FIG. 2 illustrates a block diagram of an exploded, exemplary 3-D integrated circuit package that includes a microfluidic cooling system with micropipe interconnects and heat sinks in accordance with some embodiments of the present invention.

FIG. 2 illustrates a block diagram of an exploded, exemplary three dimensional integrated circuit package 200 that includes a microfluidic cooling system 205 with micropipe interconnects and heat sinks in accordance with some embodiments of the present invention. As shown, the IC package 200 includes a microfluidic network cooling scheme that can cool three-dimensionally stacked ICs. Each silicon die of the 3D stack contains a monolithically integrated microchannel heat sink; through-silicon electrical (copper) vias (TSEV); through-silicon fluidic (hollow) vias (TSFV) for fluidic routing in the 3D stack; and solder bumps (electrical I/Os) and microscale polymer pipes (fluidic I/Os) on the side of the chip opposite to the microchannel heat sink. Microscale fluidic interconnection between strata is enabled by through-wafer fluidic vias and polymer pipe I/O interconnects. The chips are designed such that when they are stacked, each chip makes electrical and fluidic interconnection to the dice above and below. As a result, power delivery and signaling can be supported by the electrical interconnects (solder bumps and copper TSVs), and heat removal for each stratum can be supported by the fluidic I/Os and microchannel heat sinks.

Figure 3:
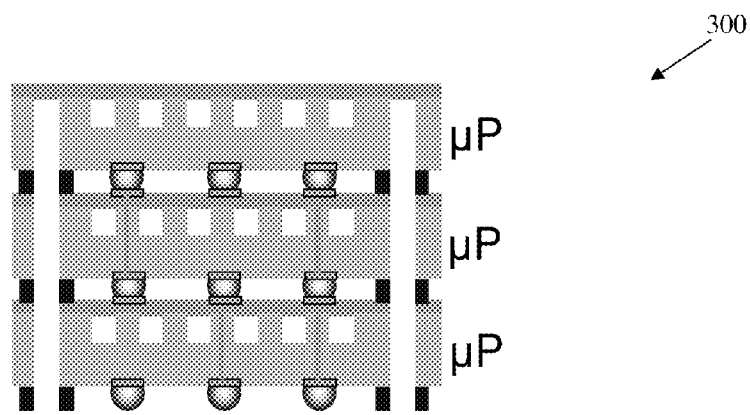
FIG. 3 illustrates a block diagram of an exemplary 3-D integrated circuit package with microfluidic channels in accordance with some embodiments of the present invention.
Figure 4:
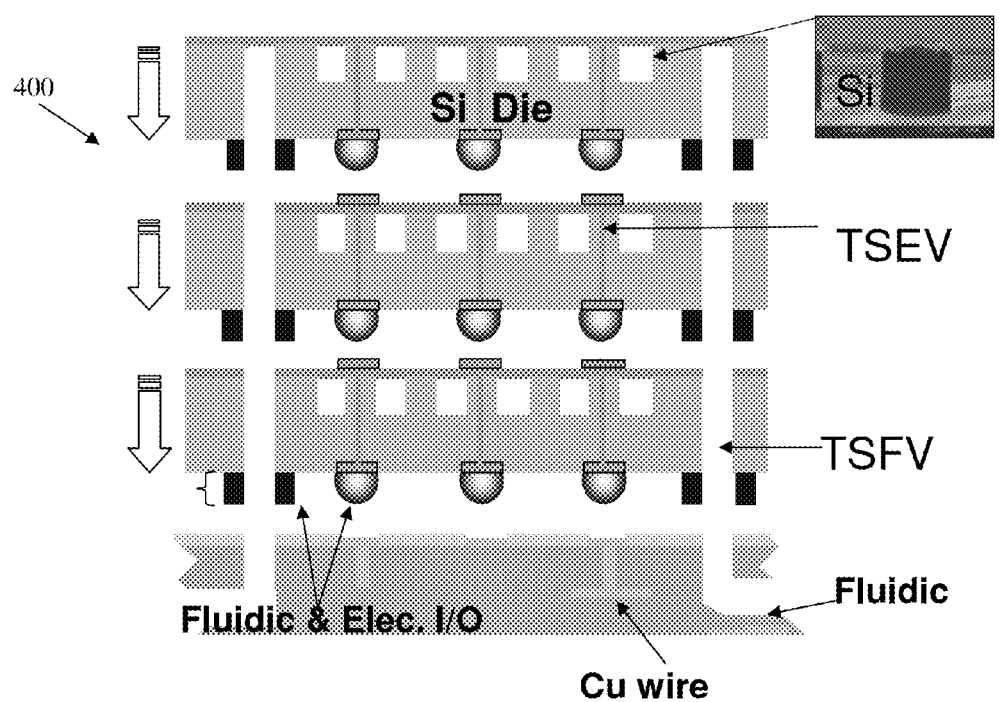
FIG. 4 illustrates a block diagram of another exemplary 3-D integrated circuit package with microfluidic channels in accordance with some embodiments of the present invention.

FIGS. 3 and 4 illustrate a block diagram of an exemplary three dimensional integrated circuit package 300 with microfluidic channels in accordance with some embodiments of the present invention. As shown, the IC package includes micropipes extending between silicon wafers. Such an arrangement enables small form factor and easy fabrication of thermally interconnected wafers in slim fabrication packages. Indeed, as show, fluidic I/Os can be assembled substantially simultaneously with electrical I/Os. Such fabrication arrangement enables thermally isolated layers due to cooling on each layers and multiple fluidic I/Os (inlets/outlets) due to wafer-level batch fabrication.

I/O and assembly technology for microchannel cooled 3D integrated circuits is illustrated in FIGS. 3 and 4, and discussed below. After solder bumping, fluidic pipes are fabricated with a polymer such as Avatrel for the top chip in a two chip 3D stack. The bottom chip in the two chip 3D stack is first assembled onto the substrate with a flip-chip bonder. Following this, the top chip in the 3D stack is assembled onto the bottom chip as shown. Underfill is dispensed to seal fluidic pipes and control co-efficient of thermal expansion mismatches between the chip and the substrate as demonstrated for single chips previously. FIGS. 3 and 4 thus demonstrate chip-level fabrication technology and assembly technology required for a microchannel cooled 3D integrated circuit.

Figure 5:
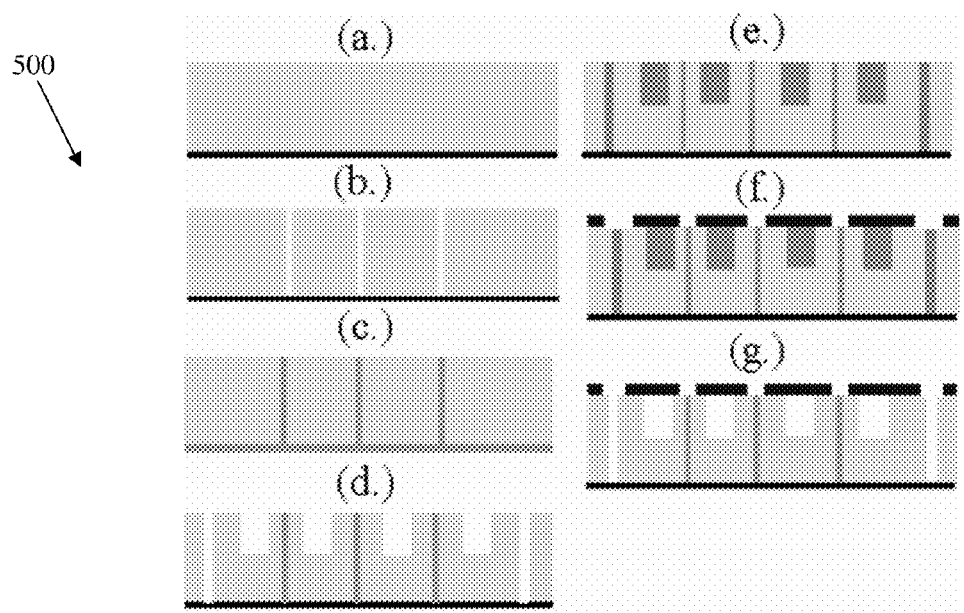
FIG. 5 illustrates a fabrication process to fabricate a 3-D integrated circuit package with microfluidic channels in accordance with some embodiments of the present invention.

FIG. 5 illustrates a fabrication process 500 to fabricate a three dimensional integrated circuit package with microfluidic channels in accordance with some embodiments of the present invention. As shown, a schematic of wafer-level integration of microchannels, through-silicon fluidic vias, and electrical through-silicon vias to enable 3D system integration using liquid cooling is enabled. Indeed, such a fabrication process can include: deposition of oxide on front-side of wafer; patterning and etching through-silicon vias; copper seed layer evaporation and electroplating; fluidic TSVs and microchannel trenches are etched into the back side of the wafer; spin coating and polishing of Unity sacrificial polymer; spin coating and patterning Avatrel polymer sockets; and simultaneous curing of Avatrel polymer and thermally decomposition of sacrificial polymer.

The process can begins by depositing a 3 µm thick layer of silicon-oxide on the front side of the wafer as a through-silicon via etch-stop layer (FIG. 3a). TSVs are patterned and anisotropically etched into the back side of the silicon wafer in an inductive coupled plasma (ICP) etching tool (FIG. 5b). After thermally growing a 1 µm layer of oxide on the TSV sidewalls, a Ti/Cu seed layer is evaporated on the front-side of the wafer. After which, copper is electroplated in the TSVs (FIG. 5c). Next, using two lithography steps, fluidic TSVs and microchannel trenches are etched into the back side of the wafer (FIG. 5d). Subsequently, Unity sacrificial polymer (Promerus, LLC) is spin-coated on the wafer, filling the fluidic TSVs and microchannels. Afterwards, mechanical polishing is performed to planarize the surface (FIG. 5e). Next, 15 µm of Avatrel 2090P polymer (Promerus, LLC) is spin-coated onto the wafer and polymer sockets are patterned (FIG. 5f). Finally, the Avatrel polymer is cured, and the Unity sacrificial polymer is thermally decomposed simultaneously, making the process CMOS-compatible (FIG. 5g). Microchannels can be formed to 200 µm tall and 100 µm wide, and the copper TSVs can have a 50 µm diameter. Platinum resistors can also be fabricated on a wafer to facilitate heating and temperature sensing. The fabrication process 500 illustrated in FIG. 5 can also be modified to yield other fabrication processes to fabricate 3-D IC packages in accordance with the present invention. For example, a fabrication process may include bonding of wafers to provide microfluidic channels. In this fabrication method, microfluidic pipes may not be utilized since channels formed in the wafers can be directly aligned in fluid communication with a need or desire for intermediate interconnects such as micropipes.

Figure 6:
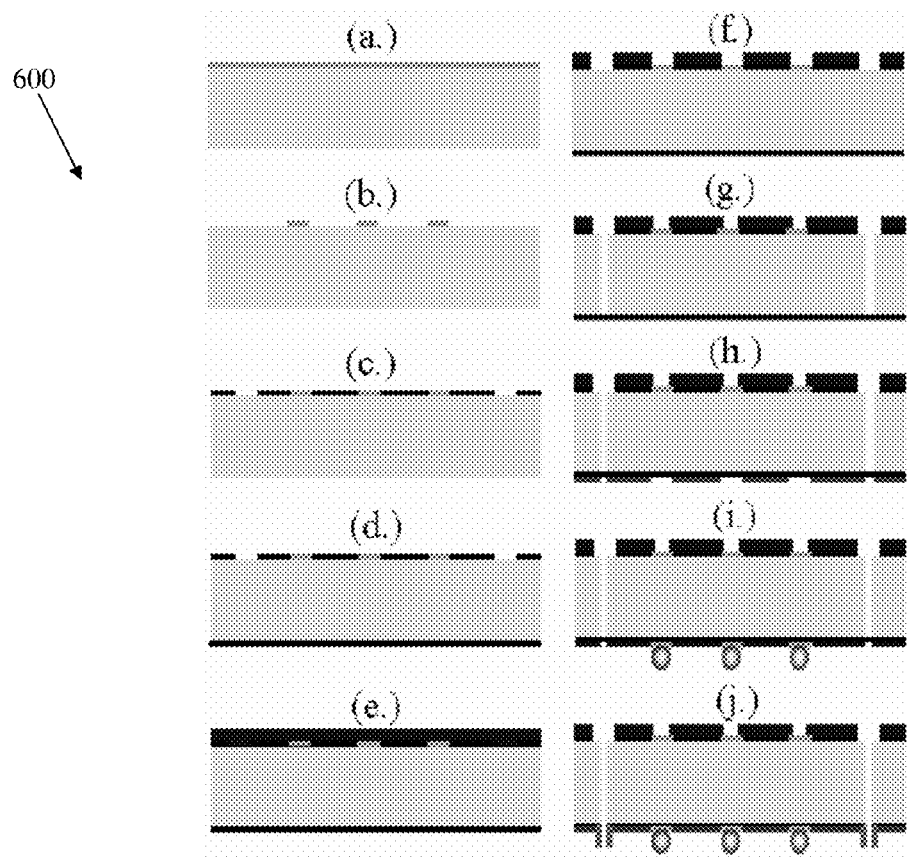
FIG. 6 illustrates another fabrication process to fabricate a 3-D integrated circuit package with microfluidic channels in accordance with some embodiments of the present invention.

FIG. 6 illustrates another fabrication process to fabricate a three dimensional integrated circuit package with microfluidic channels in accordance with some embodiments of the present invention. To address the unknowns of where to place fluidic I/O interconnects for 3D chips, how to supply fluid to each die in the 3D stack, how to assemble 3D ICs with microfluidic functionality and to demonstrate the capability of supplying fluid to each die in the 3D stack, a prototype 3D stack is demonstrated in which chips with electrical and fluidic I/Os are stacked and a coolant is circulated from the top chip, through the 3D stack, and out of the bottom of the substrate. Fabrication, as shown in FIG. 6, is a process flow for a silicon die with integrated polymer sockets, through-wafer fluidic interconnects, thermofluidic I/O interconnects, and electrical I/O interconnects.

The process 600 includes several steps. For example, the process 600 begins by sputtering a 300/10000/300 Å titanium/copper/titanium (Ti/Cu/Ti) metal layer, where Ti serves as an adhesion promoter between Cu and silicon (FIG. 6a). The metal is patterned using a wet etch process (FIG. 6b). Next, 1 µm of oxide is deposited on the back side of the wafer as a polymer adhesion layer (FIG. 6c), and 3 µm of oxide is deposited on the front side as a through-silicon via etch-stop layer (FIG. 6d). Next, 15 µm of Avatrel 2090P polymer is spin coated onto the wafer (FIG. 6e). Afterwards, polymer sockets are patterned on top of the metal (FIG. 6f). The first layer of Ti is removed using a wet-etching process. Through-wafer fluidic vias are patterned and anisotropically etched into the back side of the silicon wafer in an ICP etching tool (FIG. 6g); the etching stops at the etch-stop layer on the front side of the wafer. Next, a 12 µm layer of Avatrel polymer is spin coated and patterned on the front side of the wafer and used as a passivation layer (FIG. 6h). After sputtering a 300/2000/300 Å Ti/Cu/Ti seed layer and electroplating a FIG. 2 µm nickel under-bump metallurgy layer, 50 µm C4 solder bumps are electroplated for area-array electrical interconnects (FIG. 6i). Afterwards, a 60 µm layer of Avatrel polymer is spin coated onto the front side of the wafer and used to pattern polymer pipes, which serve as thermofluidic I/O interconnects (FIG. 6j). Finally, an oxide layer covering the through-wafer fluidic vias on the front side of the wafer is removed using a wet etch process to allow fluidic circulation.

Figure 7:
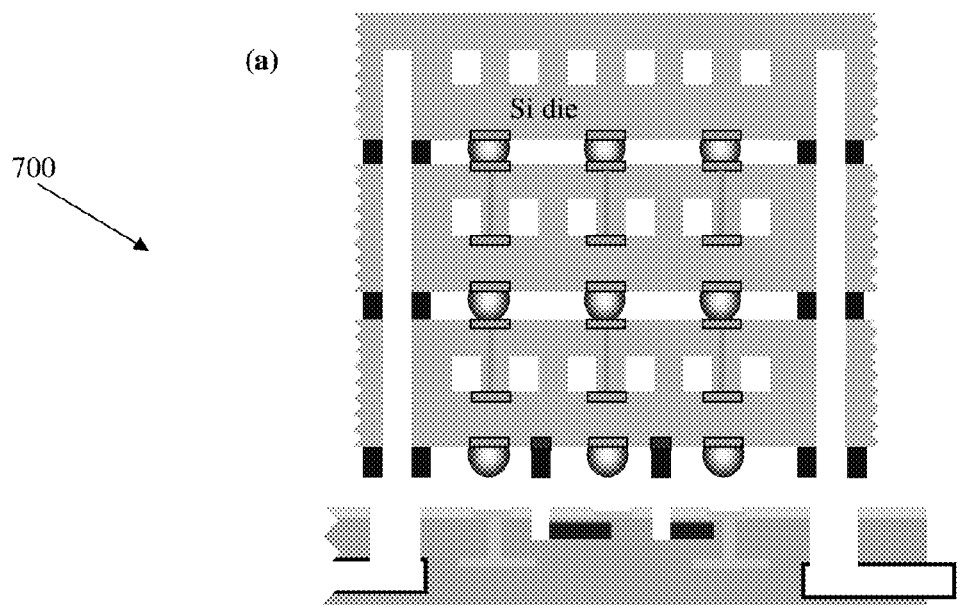
FIG. 7 illustrates a block diagram of an exemplary 3-D integrated circuit package with coolant provided from a circuit board in accordance with some embodiments of the present invention.
Figure 8:
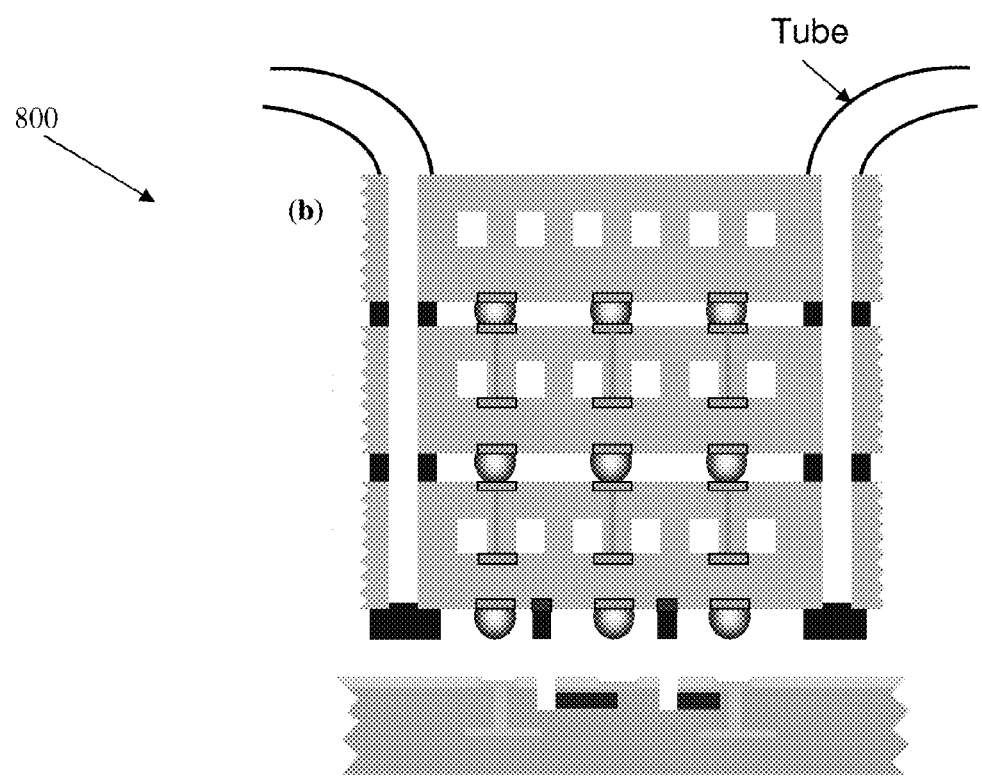
FIG. 8 illustrates a block diagram of another exemplary 3-D integrated circuit package with coolant provided from one or more external supplies in accordance with some embodiments of the present invention.
Figure 9:
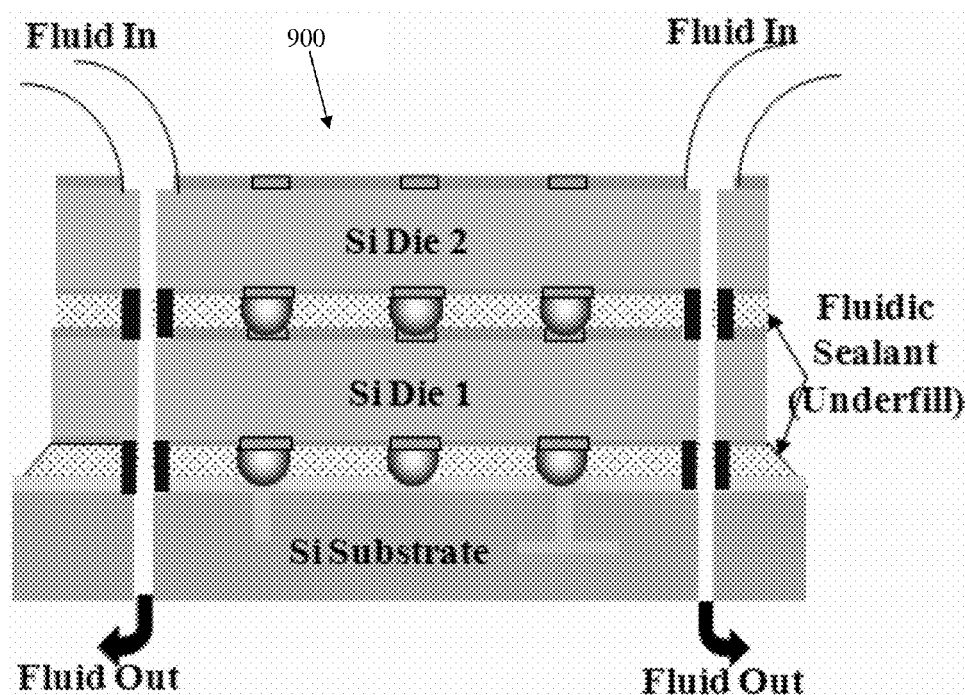
FIG. 9 illustrates a block diagram of another exemplary 3-D integrated circuit package with fluidic seals in accordance with some embodiments of the present invention.

FIGS. 7-10 illustrate block diagrams of other three dimensional integrated circuit package with coolant provided from a circuit board in accordance with some embodiments of the present invention. FIG. 7 illustrates a coolant provided from a printed circuit board carrying multiple silicon wafers and FIG. 8 illustrates how an external coolant supply can provide a coolant fluid in accordance with some embodiments of the present invention. FIG. 9 illustrates additional features of an embodiment wherein fluid coolant is provided from an external source and routed through a passageway exiting from a substrate carrying multiple silicon wafers.

Figure 10:
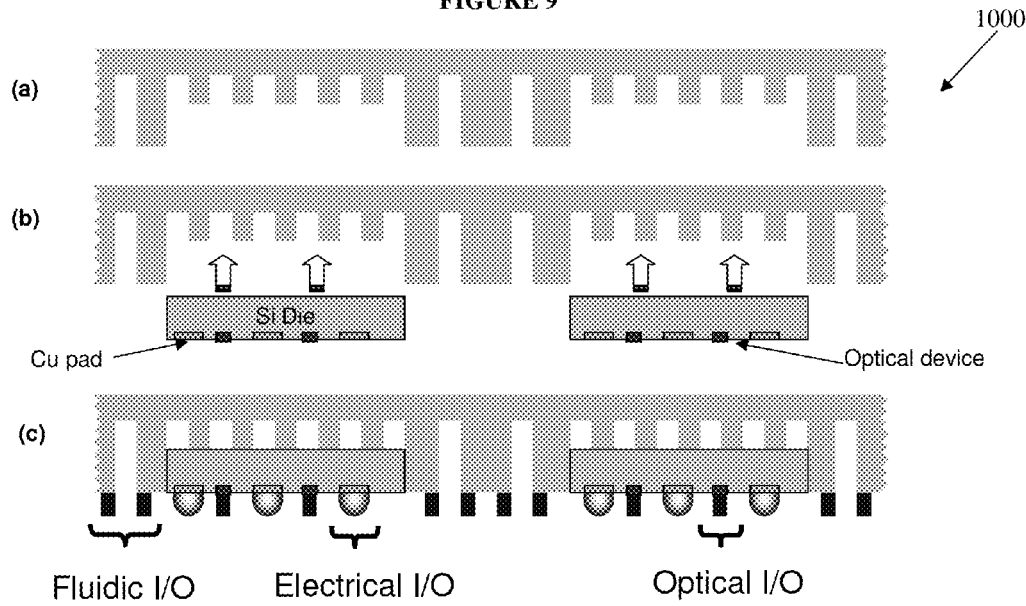
FIG. 10 illustrates a block diagram of another exemplary 3-D integrated circuit package with a carrier microchannel heat sink wafer in accordance with some embodiments of the present invention.

And FIG. 10 illustrates another embodiment of the present invention providing a process for assembling a silicon CMOS dice into a carrier microchannel heat sink wafer. FIG. 10 also illustrates subsequent steps to fabricate electrical, optical, and fluidic I/Os. A key feature of this embodiment enables integration of a microchannel heat sink on a CMOS die without the need for a thermal interface material (TIM) and using low-cost assembly and fabrication processes. For example, there is no need to reconcile the fabrication of the microchannel heat sink with CMOS wafer. In addition, two different wafers can be fabricated in two different foundries.

Figure 11:
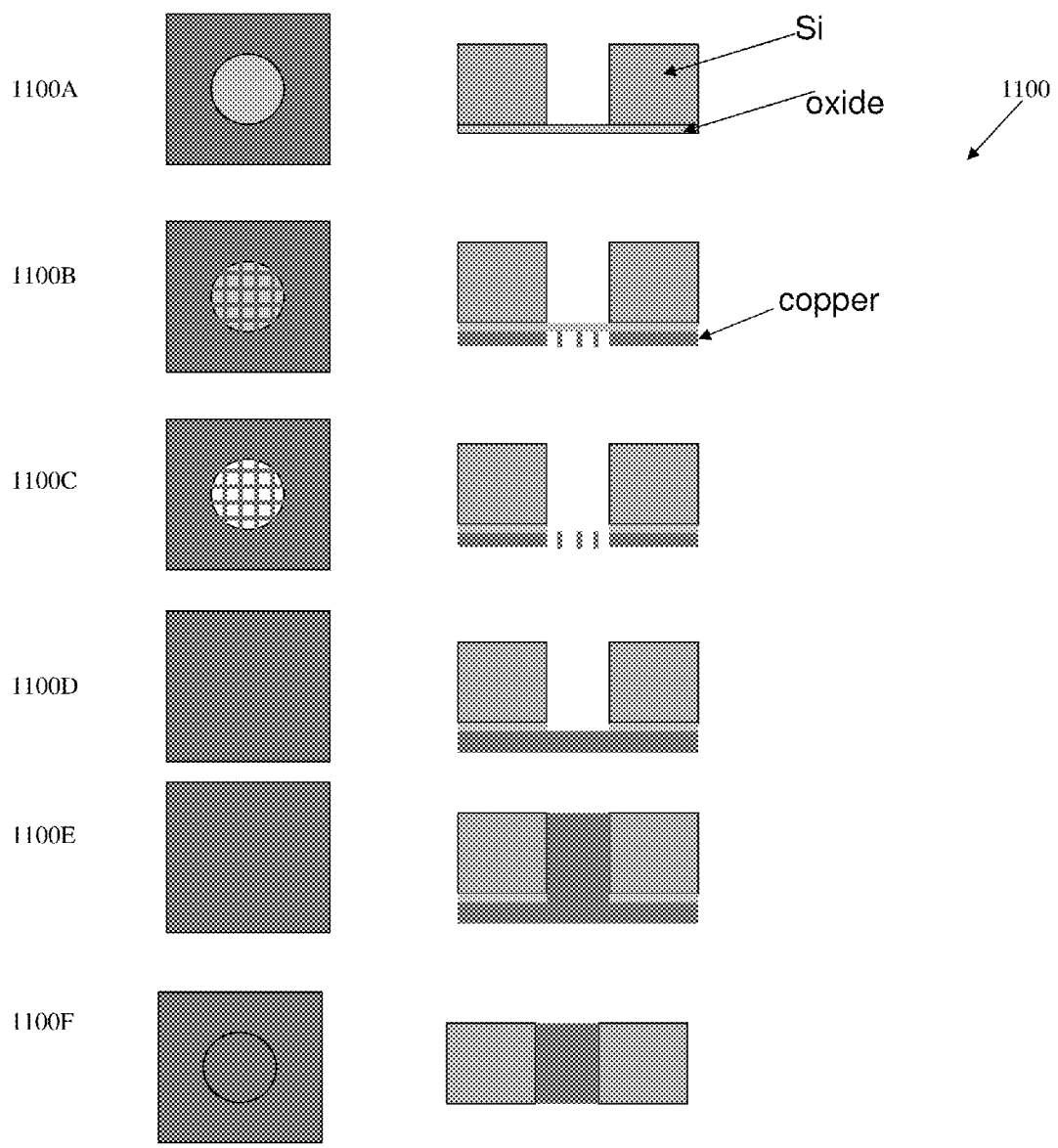
FIG. 11 illustrates a mesh seeding layer process to fabricate through silicon vias for 3-D integrated circuit packages in accordance with some embodiments of the present invention.

FIG. 11 illustrates a mesh seeding layer process 1100 to fabricate through silicon vias for 3-D integrated circuit packages in accordance with some embodiments of the present invention. As shown in FIG. 11, the process 1100 can be used for fabricating electrical through silicon vias (or TSVs). The process 1100 essentially enables filling a through-silicon via with a sacrificial material after etching. Then a seed layer can be deposed over the sacrificial layer (e.g., a seed layer of copper) (1100A). The seed layer can be performed in a mesh arrangement leaving material pillars (e.g., copper pillars placed in gaps) (1100B, 1100C). Removal of the sacrificial layer can the be performed (1100D). Next, material electrodeposition (e.g., copper deposition) can then be used to fill vias created when seeding material (1100E, 1100F) to yield a through silicon via. Advantageously, the process 1100 can greatly reduce the time it takes for horizontal pitch-off used in some fabrication processes.

Figure 12:
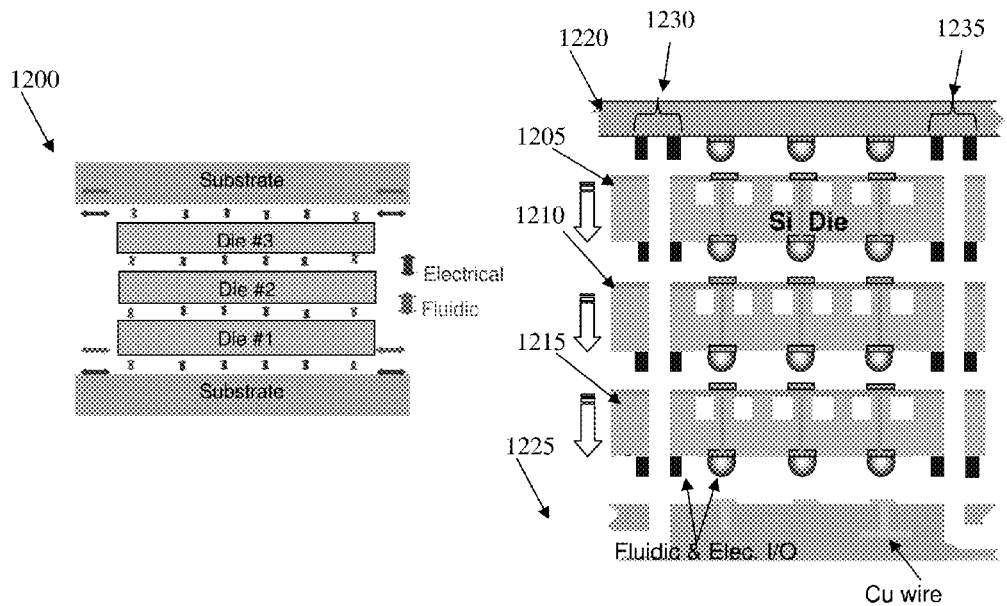
FIG. 12 illustrates a block diagram of yet another exemplary 3-D integrated circuit package having double sided delivery of power, cooling fluids, and signals in accordance with some embodiments of the present invention.

FIG. 12 illustrates a block diagram of yet another exemplary 3-D integrated circuit package 1200 having double sided delivery of power, cooling fluids, and signals in accordance with some embodiments of the present invention. In general, the package 1200 can comprise multiple dies or wafers 1205, 1210, 1215 disposed between two substrates 1220, 1225. As shown, the package is shown in a slightly exploded view. Features can be provided to enable power delivery, cooling, and signaling from both of the wafers 1220, 1225. This advantageously enables provision power, cooling, and signaling from opposing sides (e.g., opposing top and bottom sides) of a 3-D integrated chip package.

Power and signals can be provided to the wafers 1205, 1210, 1215 via electrical conductors from the substrates 1220, 1225. Power and signals can also be dispersed through the package 1200 via interconnects coupling the wafers 1205, 1210, 1215 and the substrates 1220, 1225 and via interconnects coupling adjacent wafers 1205, 1210, 1215. By utilizing double side power and signal distribution, embodiments of the present invention can provide low noise packages. In some embodiments, some or all of the interconnects can be optical interconnect to enable the transmission of optical signals.

Fluidic cooling can be provided in various manners as discussed herein. As shown, in FIG. 12, coolant fluid can be provided via microfluidic pipes or interconnects. These microfluidic pipes can be similar to those discussed above and for brevity the same features will not be discussed here. What is shown in FIG. 12 to be is that the top substrate 1220 can also include one or more microfluidic pipe couplers 1230, 1235. This enables a continuous cooling network to be configured for passing through the package at varying wafer levels.

Figure 13:
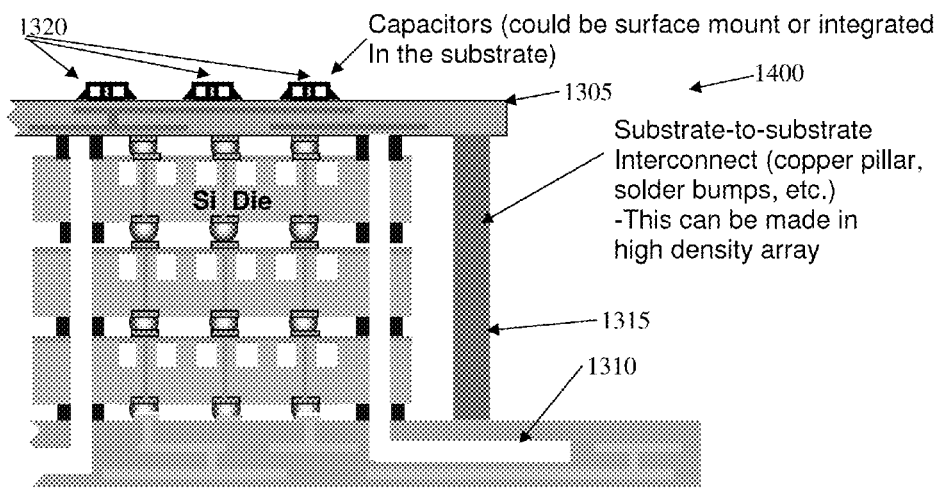
FIG. 13 illustrates a block diagram of yet another exemplary 3-D integrated circuit package having double sided delivery of power, cooling fluids, and signals in accordance with some embodiments of the present invention.
Figure 14:
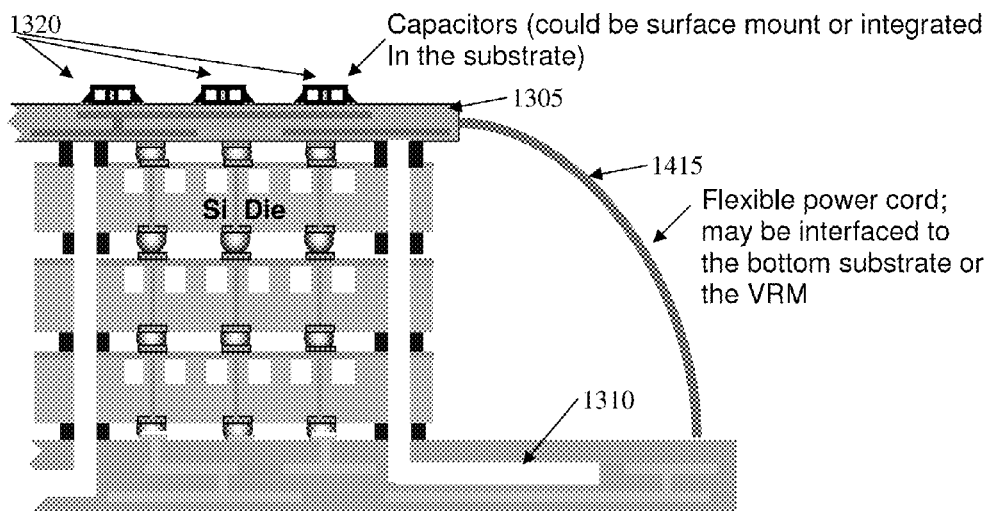
FIG. 14 illustrates a block diagram of yet another exemplary 3-D integrated circuit package having double sided delivery of power, cooling fluids, and signals in accordance with some embodiments of the present invention.

FIGS. 13-14 illustrates block diagrams of yet additional exemplary 3-D integrated circuit packages 1300, 1400 having double sided delivery of power, cooling fluids, and signals in accordance with some embodiments of the present invention. In FIG. 13, the top substrate 1305 can be coupled to a bottom substrate 1310 with a conductive interconnect 1315. This conductive coupling enables power to be provided to the top substrate 1305 for provision to the top side of the package. In FIG. 14, the conductive interconnect 1315 can be replaced with a flexible power cord 1415.

The packages 1300, 1400 also show additional features of some embodiments of the present invention. Capacitors 1320 can be provided for use with the top substrate 1305. In some embodiments the capacitors 1320 can be surface mounted and in other integrated with the substrate. Capacitors 1320 can be used for filtering or many other uses as desired. When used as filters, capacitors 1320 can be effective components for reducing power supply noise.

Figure 15:
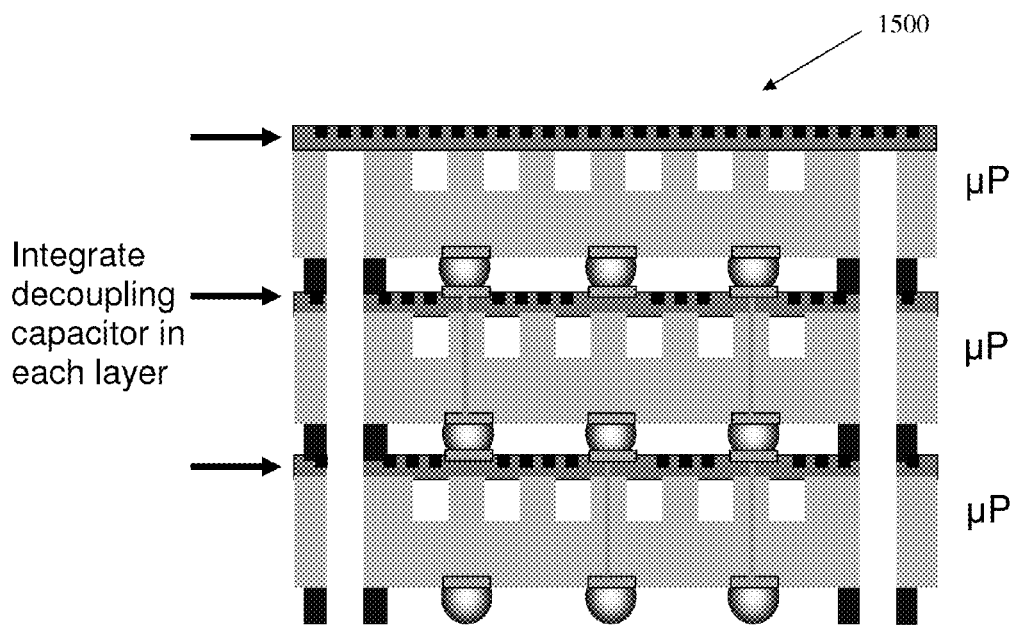
FIG. 15 illustrates a block diagram of yet another exemplary 3-D integrated circuit package having integrated decoupling capacitors in accordance with some embodiments of the present invention.

FIG. 15 illustrates a block diagram of yet another exemplary 3-D integrated circuit package 1500 having integrated decoupling capacitors in accordance with some embodiments of the present invention. This figure does not illustrate two sided power, coolant, and signal features (although it could be used in such components) as it highlights integration of decoupling capacitors with each layer of an integrated circuit package. As shown, capacitors can be integrated on each layer of silicon (or other material) within an integrated circuit package. Providing integrated capacitors in this fashion can help to reduce noise associated with power supplies.

Figure 16:
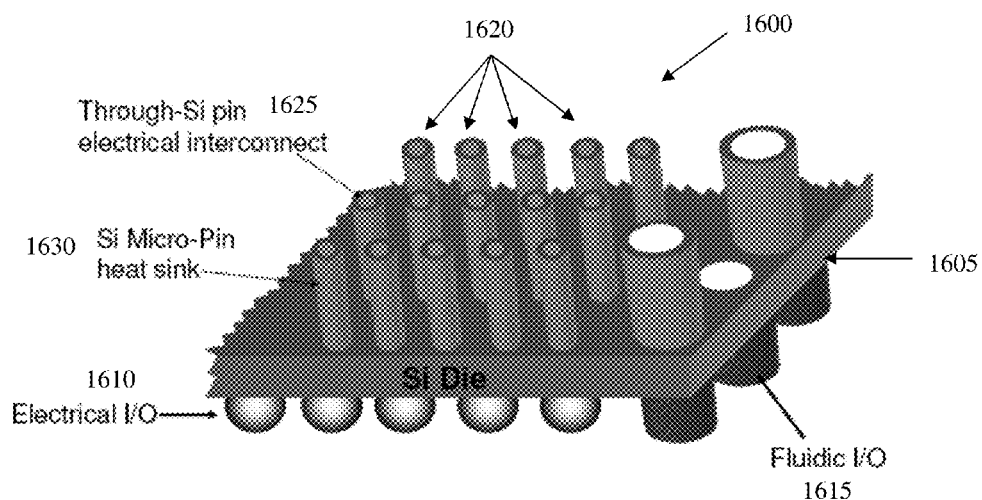
FIG. 16 illustrates a block diagram of a micro-pin heat sink for interlevel cooling in a 3-D integrated circuit package in accordance with some embodiments of the present invention.

FIG. 16 illustrates a block diagram of a micro-pin heat sink 1600 for interlevel cooling in a 3-D integrated circuit package in accordance with some embodiments of the present invention. As shown, the heat sink 1600 can include a die 1605, a plurality of electrical/optical interconnects 1610, a plurality of fluidic/coolant interconnects 1615, and a plurality of pins 1620. The pins 1620 can be used to interconnect the die 1605 to another die or substrate.

The pins 1620 can be configured to help address heat concerns. In this fashion, the pins 1620 can constitute a micro-pin heat sink for interlevel cooling in a 3-D integrated circuit package. As illustrated, each of the pins 1620 can be fabricated from an inner material 1625 and an outer material 1630. The inner material 1625 can be an electrically conductive material, such as a through silicon pin or via electrical interconnect. The outer material 1630 can be heat sink material to help move heat away from the inner material 1625 and/or proximately situated circuitry. In some embodiments, the outer material 1630 can be silicon. Fin heat sinks have low resistance and low power consumption and/or pressure drop yet are ideal for high density and area-array distributed through silicon vias.

Figure 17:
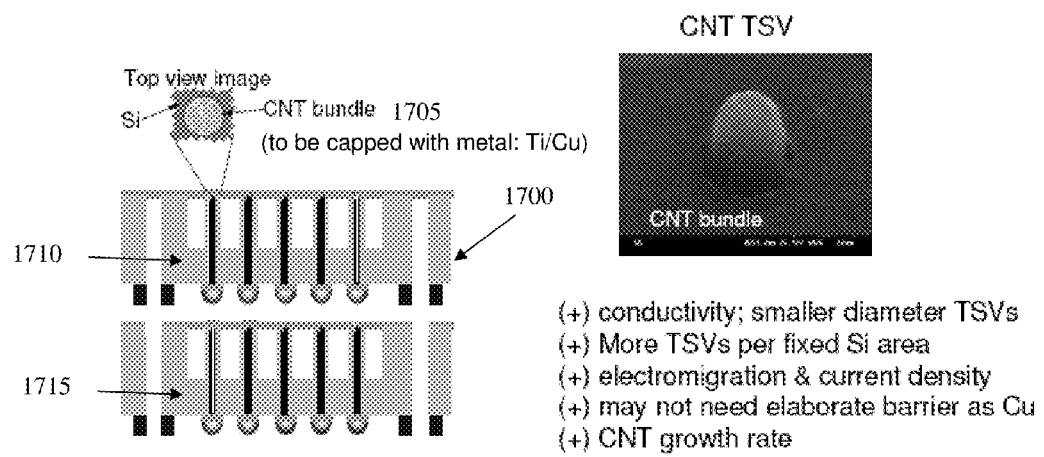
FIG. 17 illustrates a schematic diagram and an image of carbon nanotubes within a wafer and silicon heat sink for use with 3-D integrated circuit packages in accordance with some embodiments of the present invention.

FIG. 17 illustrates a schematic diagram and an image of carbon nanotubes (CNTs) within a wafer and silicon heat sink 1700 for use with 3-D integrated circuit packages in accordance with some embodiments of the present invention. The heat sink 1700 is yet another heat sink embodiment capable of being used in 3-D integrated heat sink packages as feature to control heat. The heat sink 1700 is shown in a slightly exploded arrangement with spaced apart die layers. The heat sink 1700 can include a plurality of spaced apart carbon nanotube bundles 1705 and multiple layers 1710, 1715 of a die material (e.g., silicon).

The bundles 1705 can be disposed within silicon vias and serve as interconnects. In some embodiments, ends of the bundles 1705 can be capped with a metal. The CNT image illustrates a CNT bundle having an exposed end and raised higher than the surrounding die material layer. The exposed end can be capped with a metal to bond and connect the exposed end (and the bundles 1705) to the surrounding die material layer.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of the invention are described with reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

We claim:

1. An integrated circuit package comprising:
   a plurality of semiconductor wafers each having a top exterior surface and a bottom exterior surface, the plurality of semiconductor wafers forming a multi-dimensional wafer stack of die wafers such that adjacent wafers have facing surfaces;
   each of the semiconductor wafers comprising one or more channels formed through the wafers, wherein a portion of the channels extend generally between the top and bottom exterior surfaces of the semiconductor wafers and wherein a portion of the channels carry conductors for electronically or optically coupling the semiconductor wafers; and
   opposing end substrates disposed proximate opposing ends of the multi-dimensional stack, the opposing end substrates configured to supply power between the opposing end substrates of the multi-dimensional wafer stack.

2. The integrated circuit package of claim 1, wherein the opposing end substrates are configured to supply a coolant liquid to the opposing end substrates of the multi-dimensional wafer stack.

3. The integrated circuit package of claim 1, further comprising at least one micro-pipe disposed between adjacent semiconductor wafers in the stack, the micro-pipes having opposed ends coupled to adjacent semiconductor wafers, the micro-pipes enabling at least a portion of one or more of the semiconductor wafers to be in fluid communication with each other for cooling.

4. The integrated circuit package of claim 1, wherein the opposing end substrates comprise internal electrical conductors and wherein a conductive material couples internal electrical conductors from the substrate together so that the internal electrical conductors are electrically coupled.

5. The integrated circuit package of claim 1, wherein the conductive material is one of a substrate-to-substrate interconnect and a power cord.

6. The integrated circuit package of claim 1, further comprising at least one capacitor disposed on or integrated with one of the opposing end substrates.

7. The integrated circuit package of claim 1, further comprising at least one capacitor disposed on or integrated with at least one of the semiconductor wafers.

8. The integrated circuit package of claim 1, further comprising micro-pipes disposed between adjacent semiconductor wafer surfaces, the micro-pipes being disposed in at least one of horizontal, vertical, or diagonal arrangement between semiconductor die wafers.

9. The integrated circuit package of claim 1, further comprising a plurality of micro-pin heat sinks disposed between adjacent wafers in the multi-dimensional wafer stack, the plurality of micro-pin heat sinks comprising an inner electrically conductive material arranged in a coaxial arrangement with a outer heat dissipating material.

10. The integrated circuit package of claim 1, further comprising a plurality of carbon nanotubes bundles that are disposed between and electrically couple adjacent wafers in the multi-dimensional wafer stack.

11. In a three dimensional integrated circuit package comprising multiple wafers stacked upon each other to form a three dimensional wafer stack, a system to provide power, coolant, and signals from multiple sides of the three dimensional circuit package, the system comprising:
    a plurality of semiconductor wafers stacked upon each other in a vertical arrangement to form a vertical stack of wafers;
    a plurality of electronic or optical interconnects disposed within vias disposed within the semiconductor wafers, the interconnects corresponding to interconnects in an adjacent semiconductor wafer such that adjacent semiconductor wafers are operatively configured to communicate with each other;
    a plurality of coolant fluidic channels disposed within the plurality of semiconductor wafers forming a coolant loop through the three dimensional stack to remove heat emitted from within the vertical stack of wafers; and
    opposing end substrates disposed proximate opposing ends of the vertical stack of wafers, the opposing end substrates configured to supply power and coolant between the opposing end substrates of the multi-dimensional wafer stack.

12. The system of claim 11, further comprising a plurality of micro-pipes disposed generally between semiconductor wafers to transport coolant between adjacent semiconductor wafers, each of the micro-pipes having approximately the same diameter and formed on opposing sides of the semiconductor wafers.

13. The system of claim 11, further comprising one or more capacitors and/or other passive devices disposed proximate one of the opposing end substrates and proximate at least one of the plurality of semiconductor wafers.

14. The system of claim 11, wherein at least some of the plurality of interconnects are configured as heat sinks to dissipate heat from the interconnects.

15. The system of claim 11, wherein at least some of plurality of interconnects comprise a heat dissipating material arranged around the interconnects for heat dissipation.

16. The system of claim 11, wherein at least some of the interconnects a first conductive material disposed within a second material that is a heat dissipation material.

17. The system of claim 11, wherein at least one of the plurality of semiconductor wafers defines through silicon vias and wherein carbon nanotubes bundles are disposed within the through silicon vias.

18. The system of claim 11, wherein the opposing end sources are coupled to electrical and coolant sources to provide double sided power, coolant, and electrical/optical data signals to the wafer stack.

19. The system of claim 11, wherein at least one of the opposing end substrates is an interposer that comprises silicon, glass, organic, or a combination thereof.

20. The system of claim 11, wherein at least one of the opposing end substrates is an interposer that is configured to contact to an array of 3D stacks of substantially the same height.

* * * * *